(12) United States Patent
Cascio et al.

(10) Patent No.: US 8,471,330 B2
(45) Date of Patent: Jun. 25, 2013

(54) MOS DEVICE RESISTANT TO IONIZING RADIATION

(75) Inventors: Alessandra Cascio, Messina (IT); Giuseppe Curro, Messina (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 205 days.

(21) Appl. No.: 12/709,789

(22) Filed: Feb. 22, 2010

(65) Prior Publication Data
US 2011/0042739 A1    Feb. 24, 2011

Related U.S. Application Data

(62) Division of application No. 11/982,442, filed on Oct. 31, 2007, now Pat. No. 7,791,147.

(30) Foreign Application Priority Data

Nov. 2, 2006   (IT) ............................... TO2006A0785

(51) Int. Cl.
*H01L 29/78*   (2006.01)

(52) U.S. Cl.
USPC .................. 257/328; 257/335; 257/E29.262; 438/268

(58) Field of Classification Search
USPC ... 257/328, 329, 334, 335, E29.262; 438/268
See application file for complete search history.

(56) References Cited

U.S. PATENT DOCUMENTS

| | | | |
|---|---|---|---|
| 4,587,713 A * | 5/1986 | Goodman et al. | 438/273 |
| 4,974,059 A | 11/1990 | Kinzer | |
| 5,204,541 A * | 4/1993 | Smayling et al. | 257/138 |
| 5,273,922 A | 12/1993 | Tsoi | |
| 5,296,393 A * | 3/1994 | Smayling et al. | 438/275 |
| 5,642,295 A * | 6/1997 | Smayling | 702/182 |
| 5,674,766 A | 10/1997 | Darwish et al. | |
| 5,747,850 A * | 5/1998 | Mei | 257/328 |
| 5,973,367 A * | 10/1999 | Williams | 257/365 |
| 5,973,368 A * | 10/1999 | Pearce et al. | 257/368 |
| 6,048,759 A | 4/2000 | Hshieh et al. | |

(Continued)

FOREIGN PATENT DOCUMENTS

| | | |
|---|---|---|
| EP | 0308612 | 3/1989 |
| EP | 1 503 423 A1 | 2/2005 |

OTHER PUBLICATIONS

Titus, Jeffrey I. et al.; Simulation Study of Single-Event Gate Rupture Using Radiation-Hardened Stripe Cell Power MOSFET Structures; IEEE Transactions on Nuclear Science, vol. 50, No. 6, Dec. 2003.

(Continued)

*Primary Examiner* — Allan R Wilson
(74) *Attorney, Agent, or Firm* — Graybeal Jackson LLP

(57) ABSTRACT

An embodiment of a MOS device resistant to ionizing-radiation, has: a surface semiconductor layer with a first type of conductivity; a gate structure formed above the surface semiconductor layer, and constituted by a dielectric gate region and a gate-electrode region overlying the dielectric gate region; and body regions having a second type of conductivity, formed within the surface semiconductor layer, laterally and partially underneath the gate structure. In particular, the dielectric gate region is formed by a central region having a first thickness, and by side regions having a second thickness, smaller than the first thickness; the central region overlying an intercell region of the surface semiconductor layer, set between the body regions.

16 Claims, 6 Drawing Sheets

U.S. PATENT DOCUMENTS

| | | |
|---|---|---|
| 6,084,268 A | 7/2000 | de Fresart et al. |
| 6,380,566 B1 | 4/2002 | Matsudai et al. |
| 6,407,591 B1 * | 6/2002 | Wong et al. .................... 327/63 |
| 6,486,034 B1 | 11/2002 | Huang et al. |
| 6,773,995 B2 | 8/2004 | Shin et al. |
| 6,825,531 B1 | 11/2004 | Mallikarjunaswamy |
| 2001/0009790 A1 | 7/2001 | Hsing |
| 2002/0063266 A1 | 5/2002 | Lee |
| 2003/0151088 A1 | 8/2003 | Chen et al. |
| 2004/0164346 A1 | 8/2004 | Venkatraman |
| 2004/0251492 A1 | 12/2004 | Lin |
| 2004/0262680 A1 | 12/2004 | Ehwald et al. |
| 2007/0200195 A1 | 8/2007 | Tanaka et al. |
| 2007/0262376 A1 | 11/2007 | Dudek et al. |
| 2008/0001220 A1 * | 1/2008 | Bhalla et al. .................. 257/330 |

OTHER PUBLICATIONS

Titus, Jeffrey I. et al.; SEE Characterization of Vertical DMOSFETs: An Updated Test Protocol; IEEE Transactions on Nuclear Science, vol. 50, No. 6, Dec. 2003.

European Search Report for Eurpoean Patent Application No. 07119878.2, dated Feb. 16, 2009.

* cited by examiner

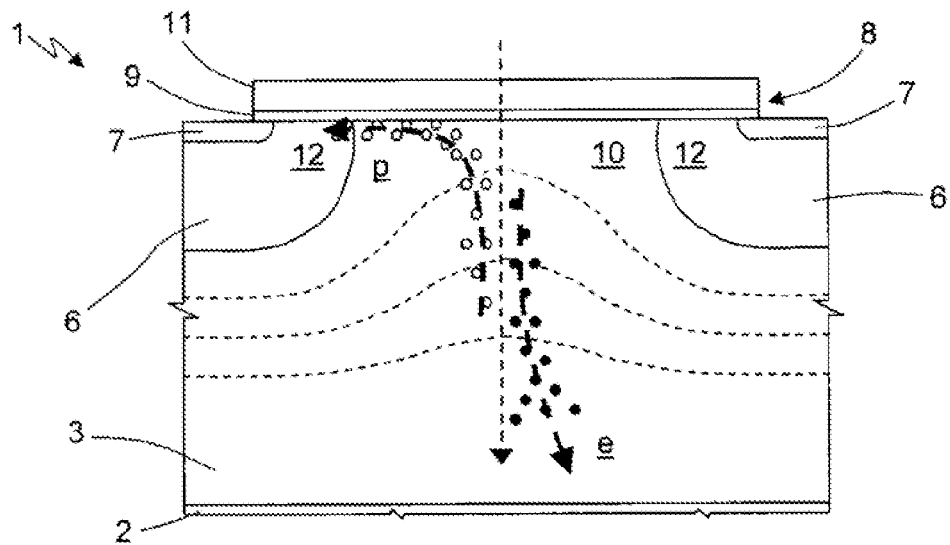
Fig.1 - Prior Art
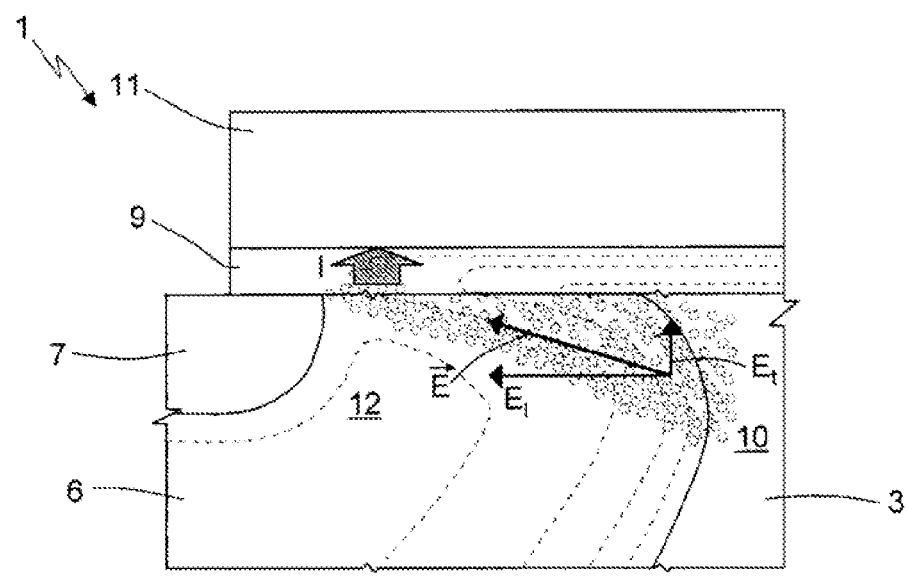
Fig.2 - Prior Art

MOS DEVICE RESISTANT TO IONIZING RADIATION

PRIORITY CLAIM

The present application is a Divisional of U.S. patent application Ser. No. 11/982,442, filed Oct. 31, 2007 now U.S. Pat. No. 7,791,147, which claims priority from Italian patent application No. TO2006A 00785, filed Nov. 2, 2006, which applications are incorporated herein by reference in their entirety.

TECHNICAL FIELD

An embodiment of the present invention disclosure relates to a MOS device resistant to ionizing radiation, in particular to a power VDMOS (Vertical Double-Diffused Metal Oxide Semiconductor) device, to which the following description will make explicit reference without this implying any loss in generality.

BACKGROUND

As is known, discrete power semiconductor devices used in a space environment, for example, in space systems such as orbital satellites or vehicles for space exploration, typically must intrinsically have a high reliability. In particular, these devices must be resistant to space ionizing radiation, such as electromagnetic radiation of extremely high energy and penetrative power (gamma rays), beams of protons or electrons with energies even much higher than one MeV, cosmic rays constituted by more or less heavy ions having energies even higher than one TeV, or secondary irradiation by electromagnetic beams or beams of particles generated within the same space systems due to interactions with the cosmic radiation. The interaction between the above sources of radiation or particles and the semiconductor device during operation can trigger mechanisms of electrical degradation (ionization) or physical degradation (lattice dislocation), which can evolve in a quasi-instantaneous or cumulative way up to thermal destruction of the device.

In discrete power MOSFET devices, the mechanisms underlying the possible physical degradation or failure are basically of two types, known as:

TID (Total Ionizing Dose), i.e., generation of electron-hole pairs within dielectric layers and consequent accumulation, over time, of trapped charge, prevalently holes, in active and passive layers of the device, with progressive degradation of its operating characteristics;

SEE (Single-Event Effects), i.e., quasi-instantaneous triggering of mechanisms of localized energy overload, which can give rise to marked drifts of the drain local electrical field and to derating of the drain-source breakdown voltage (process defined as SEB, Single-Event Burnout), or even to extremely high transient flows of charge or overvoltage pulses through active dielectric layers, with consequent permanent dielectric rupture (process defined as SEGR, Single-Event Gate Rupture).

The above mechanisms are accompanied by an equally harmful degradation (at least in part cumulative) of gate dielectric on the active channel, caused by a drain overcurrent occurring in a transient way due to the interaction between a heavy ion and the active area of the device in the OFF state. In time intervals of a few nanoseconds, an anomalous and intense current of carriers moves in a surface portion of the drain region towards the gate dielectric, and is in part driven by the electrical field towards the channel of the device.

In this regard, reference is made to FIG. 1, showing a VDMOS device 1, comprising in a known manner: a substrate 2 of semiconductor material; an epitaxial surface layer 3, also of semiconductor material, having the same type of conductivity (for example, of an N type) as the substrate 2 and overlying the same substrate 2; a plurality of cells formed in a surface portion of the epitaxial surface layer 3, each comprising a body well 6 having conductivity opposite to that of the epitaxial surface layer 3 (in the example, of a P type), and a source region 7, set within the body well 6, and having the same type of conductivity as the substrate 2; an insulated gate structure 8, constituted by a dielectric gate region 9, formed above the intercell region comprised between adjacent body wells 6 (a surface portion of which is known as neck region, designated by 10) and partially overlapping the body wells 6 and the source regions 7, and by a gate-electrode region 11, formed on the dielectric gate region 9; as is known, the substrate 2 has the function of drain for the VDMOS device 1.

The interaction between a heavy ion and the active area of the device generates a flow of electrons (designated by $\overline{e}$) directed towards the substrate 2, and a corresponding flow of holes (designated by $\overline{p}$) directed towards the conduction channel of the device (designated by 12 and defined by the portion of the body wells 6 set directly underneath the insulated gate structure 8, and delimited by the junction between the source region 7 and the body well 6 on one side, and by the junction between the body well 6 and the neck region 10, on the other). As highlighted in the detail of FIG. 2 (where field lines are represented with dashed lines), the surface geometry in the active area has a considerable influence in defining the intensity of the electrical-field transverse component $E_t$ (i.e., the component directed orthogonally to the surface of the epitaxial surface layer 3). This component, together with the electrical-field longitudinal component $E_l$, determines the direction of the resultant electrical field $\vec{E}$, which is directed as a whole towards the gate dielectric on the conduction channel 12. A current I directed towards the dielectric gate region 9, or also injected into it, is thus originated, which can entail a progressive charging of the dielectric. This phenomenon can be increased by the effect of current amplification due to the interaction between the charge generated by ionization by the ion and the electrical drain field, and also by triggering of surface conduction of the parasitic bipolar transistor formed by the source region 7, the body region 6, and the drain region (epitaxial surface layer 3).

Typically, technological choices for reducing the incidence of SEGR or charge injection in the dielectric gate region 9 involve the planar geometry of the active area or the thickness of the dielectric gate region 9. In particular, a uniform increase in the thickness of this region (typically constituted of silicon oxide) has proven effective in reducing the probability of SEGR both in the neck region 10 and in the channel region. In fact, the increase in thickness leads to a considerable reduction in the electrical-field transverse component $E_t$, and thus in the injection/trapping of charge in the dielectric. At the same time, however, it has been found that thickening of the gate dielectric leads to a deterioration of the resistance to TID mechanism. Frequently, it is difficult to reach a compromise with TID tolerance, in particular in scaled devices, which typically must guarantee a low ON-resistance (Rdson).

SUMMARY

An embodiment of the aim of the present disclosure is a MOS device that enables a solution to the aforesaid problems and disadvantages, and in particular has a higher resistance to ionizing radiation.

BRIEF DESCRIPTION OF THE DRAWINGS

For a better understanding one or more embodiments of the inventor are now described, purely by way of non-limiting example, with reference to the attached drawings.

FIG. 1 shows a cross section of a MOS device of a known type.

FIG. 2 shows an enlarged detail of the cross section of FIG. 1.

FIG. 6b is a cross section of the wafer of semiconductor material taken along the line VI-VI of FIG. 6a.

DETAILED DESCRIPTION

As will be detailed hereinafter, an embodiment of the present disclosure envisages increasing the depth of the MOS device active area via the formation, between the substrate and the epitaxial surface layer, of a further epitaxial layer, having appropriate thickness and resistivity.

Figure 3:
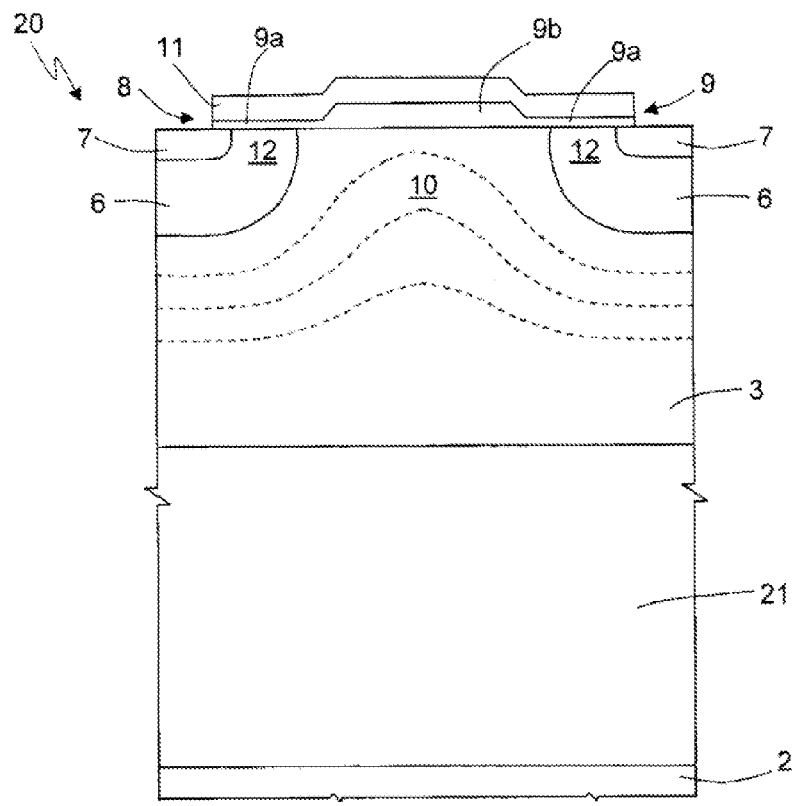
FIG. 3 shows a cross section of a MOS device, according to an embodiment of the present disclosure.

In detail, and with reference to FIG. 3 (where parts that are similar to others described previously are designated by the same reference numbers and will not be described again), in a MOS device 20, in particular of a VDMOS type, made according to an embodiment of the present disclosure, an epitaxial sublayer 21 is set between a substrate 2 and an epitaxial surface layer 3 in which device cells are provided (each comprising, as illustrated previously, a body well 6 and a source region 7). The type of conductivity of the epitaxial sublayer 21 is the same as that of the epitaxial surface layer 3, and its thickness is comparable with that of the epitaxial surface layer 3 (for example, it is comprised between approximately one half and twice the thickness of the epitaxial surface layer). Furthermore, the values of thickness and, mainly, of resistivity of the epitaxial sublayer 21 are chosen in one embodiment so as to maximize the effect of ohmic drop during the ionization transient, when the epitaxial sublayer 21 is traversed by a dense flow of electrons, which are generated by the impact of a heavy ion and by dynamic amplification mechanisms (principally, the aforesaid pre-triggering of the parasitic bipolar transistor) and are forced by the electrical field towards the drain termination.

The presence of the epitaxial sublayer 21 may lead to a double advantage: on the one hand, the active region involved in the drain electrical field E widens downwards, and hence the drain electrical field E decreases at the surface during the ionization transient; on the other hand, the gain of the parasitic bipolar transistor in conditions of strong injection is reduced due to the widening of the effective drain region (collector of the parasitic transistor), with consequent reduction in the current density of surface holes flowing towards the source region 7 and the dielectric gate region 9 during the transient. The presence of the additional epitaxial layer may entail, however, a deterioration in the performance of the MOS device 20, basically as regards the ON-resistance (Rdson); for this reason, the resistivity of the epitaxial sublayer 21 may be between 10% and 50% of the resistivity of the epitaxial surface layer. In one embodiment the resistivity of the epitaxial sublayer 21 does not exceed 50% of the resistivity of the epitaxial surface layer 3.

Another embodiment of the present disclosure, which is independent of the embodiment described previously but which contributes therewith to increasing the MOS device resistance to ionizing radiation, envisages providing a thicker layer of gate dielectric, exclusively at the neck region 10.

In detail (see again FIG. 3), the dielectric gate region 9 comprises in this case: first portions 9a, set laterally above the source region 7, the conduction channel 12, and side portions of the neck region 10, and having a first thickness (for example, smaller than 100 nm); and a second portion 9b, joined to the first portions 9a, set centrally above just the neck region 10 (in particular, above a central portion thereof) and having a second thickness, greater than the first thickness (by approximately one order of magnitude, for example comprised between 100 nm and 1500 nm). The second portion 9b has a stripe conformation and extends longitudinally and substantially coaxially with respect to an overlying gate-electrode region 11 (which also has a stripe conformation). Furthermore, lateral surfaces of the second portion 9b that are coupled to the first portions 9a can be orthogonal to the surface of the epitaxial surface layer 3, or else inclined with respect to the orthogonal direction, for example by an angle of 45°, according to the manufacturing process (as will be clarified hereinafter).

Figure 4:
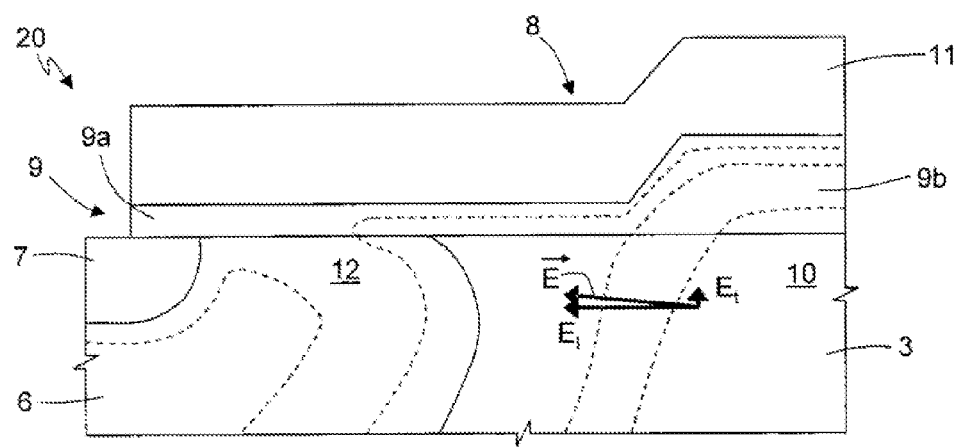
FIG. 4 shows an enlarged detail of the cross section of FIG. 3.

As illustrated also in FIG. 4, the presence of a thicker region of intercell dielectric on the neck region 10 enables a reduction of the transverse component of the electrical field $E_t$ (in particular, between gate and drain) on the neck region 10. Furthermore, the same thick intercell region induces indirectly a distortion of the distribution of surface field, which is such as to "smooth" the field lines on the surface and to reduce the transverse electrical field (in particular, between gate and source) on the conduction channel 12. Furthermore, thanks to the maintenance of a reduced dielectric thickness on the channel region 12, the problem associated to the degradation of tolerance to TID mechanism is strongly limited, at least as regards channel parameters, such as the gate-source threshold voltage ($Vgs_{th}$).

In greater detail, the lateral and vertical dimensions of the thick intercell dielectric stripe, as compared to the geometrical characteristics of the elementary cells and to the geometry and doping of the surface-drain and body regions, determine how much both the characteristics of breakdown of the MOS device 20 and the resistance to SEE of the same device are modified. In particular, the thickness of the second portion 9b of the dielectric gate region 9 maybe chosen so as not to lead to an excessive reduction in the breakdown voltage BVdss of the device; for example, this thickness is comprised between 100 nm and 1500 nm and is also a function of the technology used, the voltage class, and the required levels of tolerance to radiation. The width of the second portion 9b may also be chosen so as to maximize the "planarizing" effect on the surface drain electrical field: the second portion 9b approaches as much as possible the end of the conduction channel 12, but, for example non-overlapping with the same channel. For example, if the overlying gate-electrode region 11 (which also has a stripe conformation) is 5.7 µm wide and the lateral diffusion of the body wells 6 at the surface is 0.5 µm, the second portion 9b is, for example, 3.7 µm wide, thus leaving an adequate safety margin from the end of the conduction channel 12, of 0.5 µm on each side.

Figure 5:
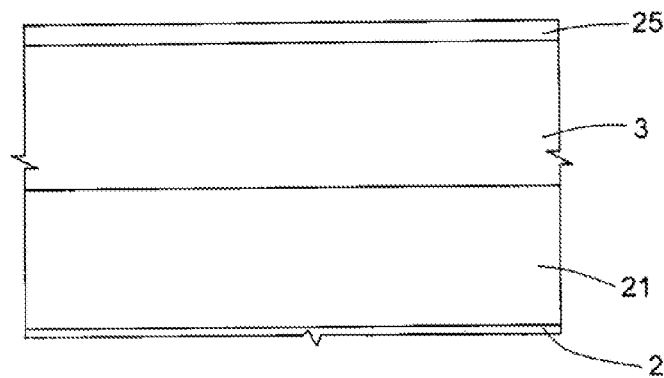
FIG. 5 shows a cross section through a wafer of semiconductor material in an initial step of a process for manufacturing a MOS device.

An embodiment of the manufacturing process of the MOS device 20 envisages first providing a wafer of semiconductor material comprising a substrate 2, and then forming the epitaxial sublayer 21 by epitaxial growth starting from the substrate 2, and forming the epitaxial surface layer 3 by epitaxial growth starting from the epitaxial sublayer 21 (FIG. 5). In particular, the epitaxial growth steps are executed prior to any phototechnique or other surface process. Next, formation of the edge termination, opening of the active area, and cleaning of the surface of the wafer are carried out in a known way and hence not described in detail herein.

Next, the stripe of thick intercell dielectric is formed, according to two alternative variants.

A first variant envisages dielectric formation via CVD. In detail, an optional step of growth of a thin film (not illustrated) of thermal oxide is first carried out before deposition of the thick gate dielectric, and then a CVD deposition of a thick dielectric layer 25 is carried out. The thick dielectric layer 25 can be SG (Silicon Glass) or preferably USG (Undoped Silicon Glass), with thicknesses of from 100 nm to 1500 nm, and the technique of deposition may be PECVD, LPCVD or APCVD; also possible is the use of dielectric multilayers. An (optional) thermal process of dielectric densification is then performed. A second variant envisages, instead, formation of the thick dielectric layer 25 via thermal growth of a dielectric film (silicon oxide, or a compound of oxynitride and silicon oxide) with a thickness of from 100 nm to 500 nm, above the epitaxial surface layer 3. The first variant is hence advantageous when it is necessary to provide large thicknesses of the dielectric stripe.

Figure 6A:
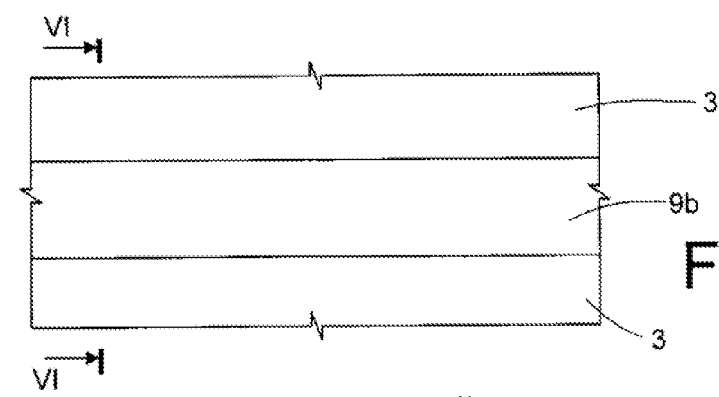
FIG. 6a is a top plan view of a portion of the wafer of FIG. 5 in a subsequent step of the manufacturing process.
Figure 6B:
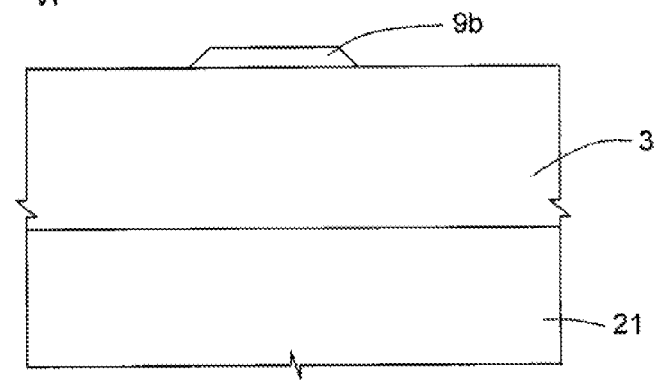

After formation of the thick dielectric layer 25, an appropriate phototechnique is carried out for definition of the stripe of intercell-gate dielectric, having a longitudinal extension (FIGS. 6a, 6b). In detail, a unidirectional dry etch, or an isotropic wet etch, of the thick dielectric layer 25 can be performed, so as to obtain the second portion 9b of the dielectric gate region 9 on the epitaxial surface layer 3. The dry etch leads to formation of side walls for the stripe that are orthogonal to the surface of the wafer, and maybe advantageous in markedly scaled devices, for containment of lateral dimensions. Wet etching may be used when the spacing between contiguous cells is not excessively small, and the thickness of the stripe is not excessive (between approximately 100 nm and 200 nm). In this case, the final inclination of the side walls of the stripe may be approximately 45°. It is also possible to envisage a sequential wet/dry etch.

A further step of cleaning of the surface of the wafer is then carried out, followed by the formation, by means of thermal oxidation, of a thin dielectric layer 26 (FIG. 7) laterally with respect to the stripe of gate dielectric. The dielectric can be, for example, oxynitride, or a multilayer of oxide, nitride, and oxide, with a thickness of less than 100 nm. A gate-electrode layer 27 is then deposited above the wafer of semiconductor material; the gate-electrode layer 27 is for example formed by doped polysilicon or by a double layer of doped polysilicon and metal silicide having a thickness of between 100 nm and 600 nm.

Figure 8:
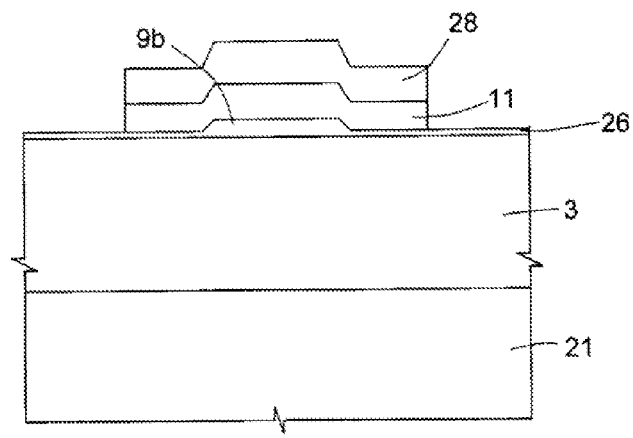

At this point, according to a first embodiment of the manufacturing process, a CVD deposition of a first dielectric layer, made of USG, PSG, TEOS, or some other dielectric or dielectric multilayer, is carried out. This is followed by a suitable phototechnique for defining the gate electrode 11 (FIG. 8). A unidirectional etch of the first dielectric layer is first performed, with end-point on the gate-electrode layer 27, so as to form a first dielectric region 28, and then a unidirectional etch of the gate-electrode layer 27, for a given time or with end-point on the thin dielectric layer 26, is carried out.

Figure 9:
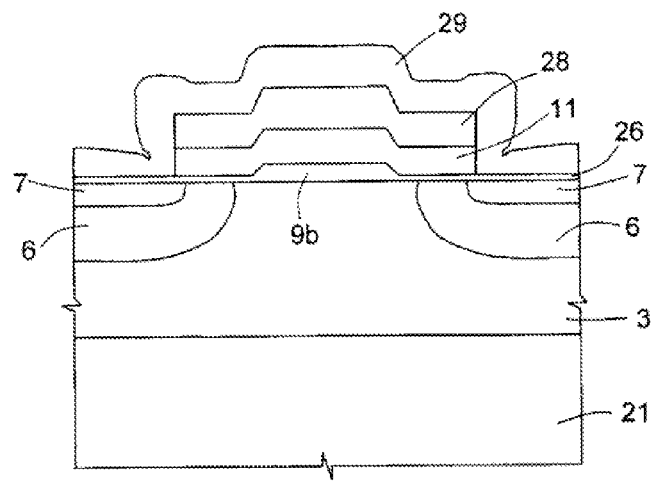

Next (FIG. 9), in a known way that is not described in detail, a first process of ion implantation and diffusion, for formation of the body wells 6, and then (by means of an appropriate masking) a second process of ion implantation and diffusion for formation of the source regions 7 within the body wells 6 are performed. In particular, after the diffusion, the body wells 6 extend underneath the gate structure, but not underneath the second portion 9b of the dielectric gate region 9.

Then a CVD deposition is performed of a second dielectric layer 29, which is to form spacers. The second dielectric layer 29 can be made of USG, PSG, TEOS, or some other dielectric or dielectric multilayer with low conformability, and its thickness may depend directly on the planar geometry of the wafer.

Figure 10:
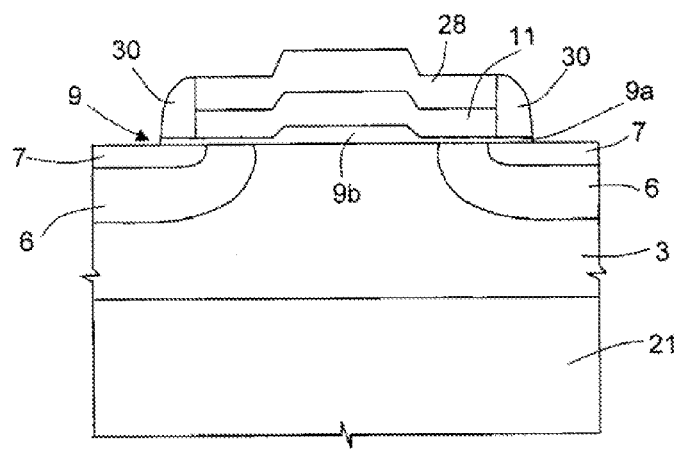

After a step of dielectric densification, a unidirectional etch is performed of the second dielectric layer 29 to form spacers 30 at the sides of the gate structure, and hence of the first dielectric region 28 and of the gate-electrode region 11 (FIG. 10). The etch removes also part of the thin dielectric layer 26, exposing the underlying source regions 7, and defining the first portions 9a of the dielectric gate region 9.

There follow optional steps, of a known type, of dry etching for a given time of silicon to form soft trenches, of metal deposition (Co, Pt, or other material) to form a metal silicide, followed by sintering of the film of contact silicide (having a thickness of 10÷100 nm) and by removal of the residual metal from the dielectric surfaces, and of deposition of a metallurgical barrier at the contact (Ti/TiN or the like). A photomasking is then carried out for opening gate contacts on pads, with a known technique.

Figure 11:
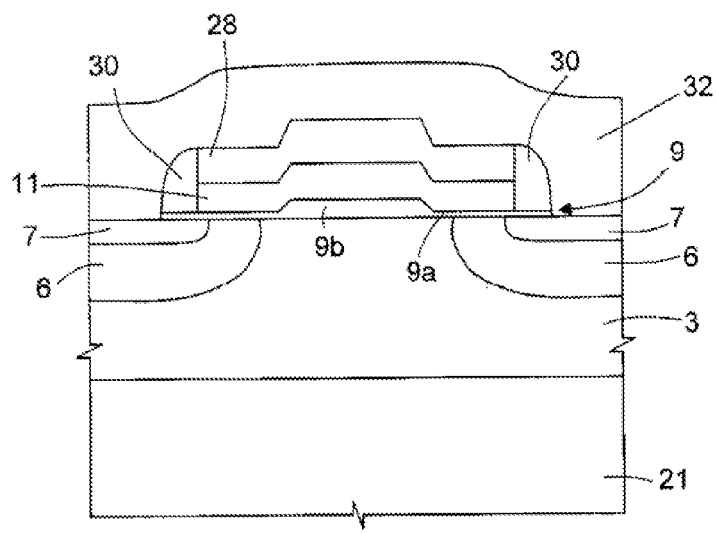

The process terminates with metallization of the front of the wafer, which leads to formation of a metal layer 32 (FIG. 11), constituted, for example, by an aluminium alloy, and with "patterning" of the same metal layer. There follow deposition and photolithography of the final passivation, according to known techniques, and preparation and metallization of the back of the wafer (drain contact of the device).

A second embodiment of the manufacturing process envisages provision of the lateral insulation of the source contacts (in particular from the gate electrode 11) not via spacers as described previously (so-called self-aligned technique), but via the use of a photolithographic technique.

Figure 7:
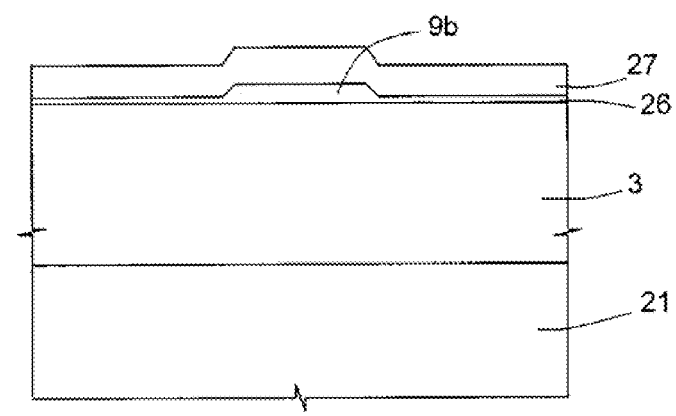
FIGS. 7-11 show cross sections similar to that of FIG. 6b in subsequent steps of the manufacturing process, according to a first embodiment of the present disclosure.
Figure 12:
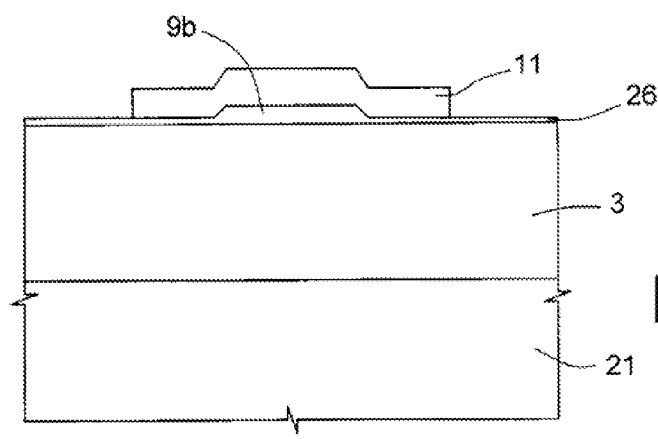
FIGS. 12-15 show cross sections through a wafer of semiconductor material in subsequent steps of a process for manufacturing a MOS device, in accordance with a second embodiment of the present disclosure.

In detail, starting from the structure described in FIG. 7 (after deposition of the gate-electrode layer 27), through an appropriate masking, a unidirectional etch of the gate-electrode layer 27 is performed, for a given time or with end-point on the underlying thin dielectric layer 26 to form the gate electrode 11 (FIG. 12).

Figure 13:
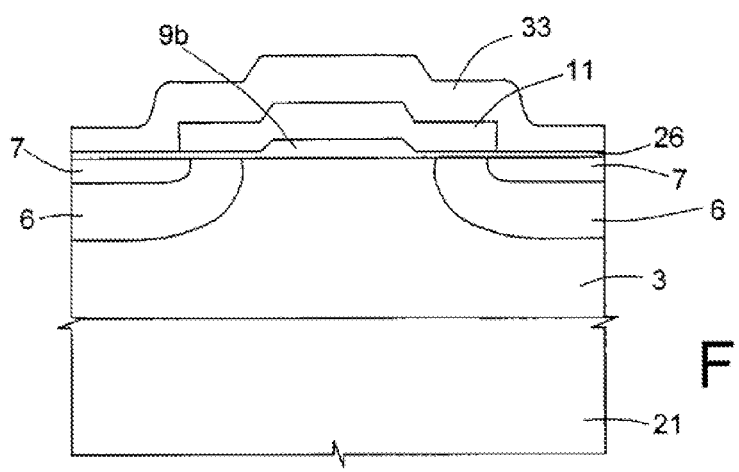

There follow processes of ion implantation and diffusion for formation of the body wells 6 and source regions 7, and CVD deposition of an intermediate dielectric layer 33 on the gate electrode 11 and the surface of the wafer (FIG. 13). The dielectric can once again be USG, PSG, TEOS, or some other dielectric or dielectric multilayer.

Figure 14:
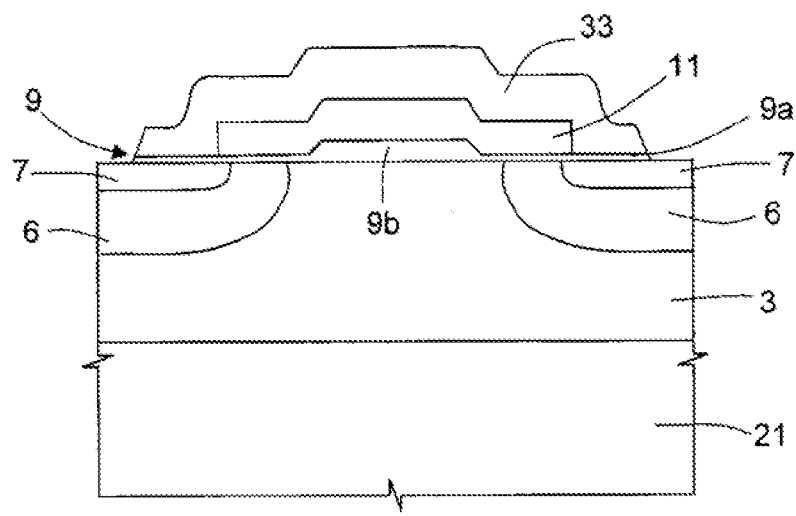

After a step of dielectric densification, a photomasking is carried out for opening the contacts, and in particular a dry etch or composite (dry/wet) etch of the intermediate dielectric layer 33. The etch removes also part of the thin dielectric layer 26, exposing the underlying source regions 7 and defining the first portions 9a of the dielectric gate region 9 (FIG. 14).

Figure 15:
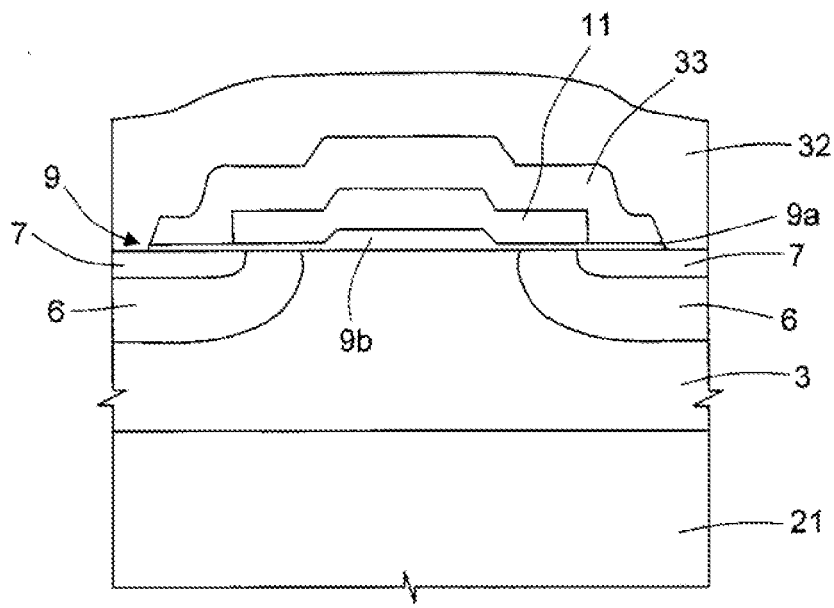

There follow the final steps described previously, and in particular metallization of the front for formation of the metal layer 32 (FIG. 15).

From what has been described and illustrated above, advantages of the MOS device and the corresponding manufacturing process according to an embodiment of the disclosure are evident.

In particular, an embodiment of the MOS device 20 has a high resistance to ionizing radiation and to electrical/physical degradation resulting therefrom in so far as it meets the dual need of: reducing the current density of holes flowing towards the gate and source regions during the transient (by means of the epitaxial sublayer 21); and of reducing the transverse component of the electrical field $E_t$ between the gate and the drain on the neck region 10 and between the gate and the source on the conduction channel 12 (by means of the stripe of thick gate dielectric).

Given the particular conformation an embodiment of the dielectric gate region 9, having a greater thickness only at the central stripe portion set above the neck region 10, it is also possible to reach a good compromise as regards resistance to the TID mechanism of the MOS device 20.

Furthermore, the composite structure of the dielectric gate region 9 on the elementary cell leads to further advantages in the performance of the MOS device 20, apart from the reliability effects. Amongst these, the most evident is the reduction in the gate capacitance, which leads to a sensible increase in the switching rate of the MOS device 20.

Finally, it is clear that modifications and variations can be made to what is described and illustrated herein, without thereby departing from the scope of the present disclosure.

In particular, it is evident that what has been described and illustrated can be applied advantageously to power VDMOS devices having any type of edge-termination structure, and with the stripe in the active area having any dimension. The same teachings may be applied in other MOS devices, such as, for example, signal VDMOSs, IGBTs, and MOSFETs both of the N-channel and of the P-channel type. Furthermore, even though the entire description has been referred to the case of a P-channel VDMOS device, extension to the dual case of an N-channel VDMOS device is immediate.

In addition, it is to be noted that the geometrical parameters of the device (for example, in terms of thickness and resistivity of the epitaxial layers, width of the stripe of gate dielectric, spacing between contiguous stripes, longitudinal pitch, and width/shape of the periodic contact cells) may vary according to the required functions, the design technology, and the characteristics required of the device. For example, the second portion 9b of the dielectric region 9 may even have a width equal to the width of the neck region 10, also in this case not overlapping with respect to the conduction channel 12.

Finally, it is again emphasized that, even though two embodiments of the disclosure (presence of the epitaxial sublayer 21 and of the thick dielectric stripe limitedly to the neck region 10) have been illustrated in combination and are jointly particularly advantageous (in so far as they enable a simultaneous solution to two main problems caused by ionizing radiation), they can possibly be implemented independently of one another.

The MOS device of 20 FIG. 3 (or a device having fewer than all of the attributes of the device 20) may be disposed on an integrated circuit (IC) such as a processor or memory, which may be disposed within a system such as a computer system.

What is claimed:

1. A system, comprising:
  a semiconductor device, comprising
    a substrate having a first conductivity type,
    a first layer disposed over the substrate and having the first conductivity type,
    a second layer disposed over the first layer with different resistivity and having the first conductivity type,
    a body region disposed in the second layer and separated from the first layer and having a second conductivity type,
    a source region disposed in the body region and having the first conductivity type, and
    a gate electrode disposed over the second layer and the source region; and
  a controller coupled to the semiconductor device.

2. The system of claim 1 wherein:
  the semiconductor device is disposed on a first die; and
  the controller is disposed on a second die.

3. The system of claim 1 wherein the semiconductor device and the controller are disposed on a same die.

4. The system of claim 1 wherein the semiconductor device comprises a transistor.

5. The system of claim 1, wherein the first layer and the second layer comprise epitaxial layers.

6. The system of claim 1, wherein the first layer comprises a resistivity between 10% and 50% of the resistivity of the second layer and comprises a thickness between 50% and 200% of the thickness of the second layer.

7. The system of claim 1, operable in space environment applications.

8. A system, comprising:
  a semiconductor device, comprising
    a substrate having a first conductivity type,
    a first layer having a first conductivity type,
    a second layer disposed over the first layer with different resistivity and having the first conductivity type,
    a body region disposed in the second layer, having a second conductivity type, and bounding a region of the second layer,
    a source region disposed in the body region and having the first conductivity type,
    a gate insulator having a first portion disposed over the body region and having a second portion disposed over the bounded region of the second layer, the first portion having a first thickness, the second portion having a second thickness that is greater than the first thickness, and
    a gate electrode disposed over the gate insulator; and
  a controller coupled to the semiconductor device.

9. The system of claim 8, wherein:
  the semiconductor device is disposed on a first die; and
  the controller is disposed on a second die.

10. The system of claim 8, wherein the semiconductor device and the controller are disposed on a same die.

11. The system of claim 8, wherein the semiconductor device comprises a transistor.

12. A system, comprising:
  a semiconductor device, comprising
    a substrate having a first conductivity type,
    a first layer disposed over the substrate and having the first conductivity type,
    a second layer disposed over the first layer with different resistivity and having the first conductivity type,
    a body region disposed in the second layer and having a second conductivity type,
    a first source region disposed in the body region and having the first conductivity type,
    a second source region disposed in the body region and having the first conductivity type of conductivity, such that an intercell region having a respective channel region is formed between the first and second source regions, wherein side regions of the first and second source regions extend above the channel region and alongside portions of the intercell region,
a central region extends above a central portion of the intercell region; and
a gate electrode disposed over the second layer and the first and second source regions; and
a controller coupled to the semiconductor device.

13. The system of claim 12, wherein the central region has a thickness comprised between 100 nm and 1500 nm, and the side regions have a thickness smaller than 100 nm.

14. The system of claim 12, wherein the central region has a stripe conformation and extends longitudinally above the intercell region.

15. The system of claim 14, wherein the central region has side walls inclined with respect to a direction orthogonal to the surface of the surface semiconductor layer, in particular by an angle of 45°.

16. The system of claim 14, wherein the gate-electrode region also has a stripe conformation, and extends longitudinally and coaxially with respect to the central region.

* * * * *